United States Patent

Zahurak

Patent Number: 6,150,211
Date of Patent: *Nov. 21, 2000

[54] METHODS OF FORMING STORAGE CAPACITORS IN INTEGRATED CIRCUITRY MEMORY CELLS AND INTEGRATED CIRCUITRY

[75] Inventor: John K. Zahurak, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/763,337

[22] Filed: Dec. 11, 1996

[51] Int. Cl.⁷ ................................. H01L 21/8242
[52] U.S. Cl. .................... 438/244; 438/387; 438/253; 438/149
[58] Field of Search .................... 438/238–249, 438/381–392, 244, 149

[56] References Cited

U.S. PATENT DOCUMENTS

| | | | |
|---|---|---|---|
| 4,794,563 | 12/1988 | Maeda | 257/303 |
| 4,855,952 | 8/1989 | Kiyosumi | 257/304 |
| 5,001,526 | 3/1991 | Gotou | 357/23.6 |
| 5,065,215 | 11/1991 | Kubota | 257/301 |
| 5,124,765 | 6/1992 | Kim et al. . | |
| 5,223,730 | 6/1993 | Rhodes | 257/301 |
| 5,225,698 | 7/1993 | Kim et al. | 257/301 |
| 5,386,131 | 1/1995 | Sato | 257/301 |
| 5,405,801 | 4/1995 | Han et al. . | |
| 5,406,102 | 4/1995 | Oashi . | |
| 5,512,501 | 4/1996 | Hidaka | 438/151 |
| 5,521,111 | 5/1996 | Sato . | |
| 5,594,682 | 1/1997 | Lu et al. | 257/301 |
| 5,618,745 | 4/1997 | Kita | 438/243 |
| 5,698,869 | 12/1997 | Yoshimi et al. | 257/347 |
| 5,795,804 | 8/1998 | Jenq . | |
| 5,801,413 | 9/1998 | Pan . | |
| 5,811,283 | 9/1998 | Sun . | |

Primary Examiner—Jey Tsai
Attorney, Agent, or Firm—Wells, St. John, Roberts, Gregory & Markin

[57] ABSTRACT

Methods of forming capacitors and related integrated circuitry are described. In a preferred embodiment, the capacitors form part of a dynamic random access memory (DRAM) cell. According to one aspect of the invention, a first insulating layer is formed over a semiconductive material layer. A conductive gate is formed over the semiconductive material layer. A second insulating layer is formed over the gate and thereafter etched to form a capacitor container. In one implementation, such etch is conducted to outwardly expose the semiconductive material layer. In another implementation, such etch continues into the semiconductive material layer. In yet another implementation, such etch is conducted completely through the semiconductive material layer and into the first insulating layer. In a preferred implementation, a storage capacitor is formed within the capacitor container which extends both elevationally above and elevationally below the gate. According to another aspect of the invention, adjacent word lines are formed over the first insulating layer and source/drain diffusion regions are formed within the semiconductive material laterally outward of the word lines. Respective capacitor containers are etched into the diffusion regions and capacitors are formed within the etched containers. In a preferred implementation, storage node material which constitutes part of the capacitors is in electrical contact with the respective diffusion regions and comprises part of a DRAM memory cell.

8 Claims, 11 Drawing Sheets

METHODS OF FORMING STORAGE CAPACITORS IN INTEGRATED CIRCUITRY MEMORY CELLS AND INTEGRATED CIRCUITRY

TECHNICAL FIELD

This invention relates to methods of forming storage capacitors in integrated circuitry memory cells and related integrated circuitry.

BACKGROUND OF THE INVENTION

As integrated circuitry memory cells become increasingly smaller, it becomes more difficult to realize desired memory cells which have enough cell capacitance to store information for a reasonable amount of time. The industry has approached the challenge of providing cell capacitance from two different directions.

According to a first direction, storage capacitors are fabricated over a semiconductor wafer. Such capacitors, known as container capacitors, are typically formed by etching into an insulating layer which is formed over a wafer outer surface. One disadvantage of this approach is that as the memory cells continue to decrease in size, the capacitors have to become narrower and taller in construction in order to maintain a desirable capacitance. Accordingly, the topology of the wafer becomes worse from the standpoint of its impact on several processing steps such as lithography, etching, and mechanical substrate abrading such as chemical mechanical polishing.

According to a second direction, trenches are etched into a substrate and capacitors are formed within the trenches. Such capacitors are known as trench capacitors. A major disadvantage of this approach is that very deep, high aspect ratio trenches must be etched into the substrate. Additionally, complicated strapping mechanisms must be employed to ground the cell.

This invention grew out of concerns associated with increasing cell capacitance while reducing topography and strapping requirements.

SUMMARY OF THE INVENTION

Methods of forming capacitors and related integrated circuitry are described. In a preferred embodiment, the capacitors form part of a dynamic random access memory (DRAM) cell. According to one aspect of the invention, a first insulating layer is formed over a semiconductive material layer. A conductive gate is formed over the semiconductive material layer. A second insulating layer is formed over the gate and thereafter etched to form a capacitor container. In one implementation, such etch is conducted to outwardly expose the semiconductive material layer. In another implementation, such etch continues into the semiconductive material layer. In yet another implementation, such etch is conducted completely through the semiconductive material layer and into the first insulating layer.

In a preferred implementation, a storage capacitor is formed within the capacitor container which extends both elevationally above and elevationally below the gate. According to another aspect of the invention, adjacent word lines are formed over the first insulating layer and source/drain diffusion regions are formed within the semiconductive material laterally outward of the word lines. Respective capacitor containers are etched into the diffusion regions and capacitors are formed within the etched containers. In a preferred implementation, storage node material which constitutes part of the capacitors is in electrical contact with the respective diffusion regions and comprises part of a DRAM cell.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
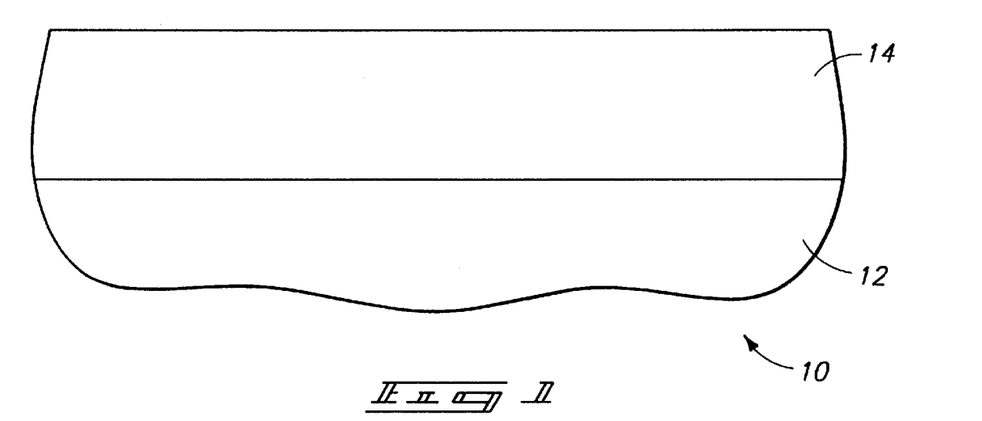
FIG. 1 is a diagrammatic sectional view of a semiconductor wafer fragment at one processing step in accordance with the invention.

Referring to FIG. 1, a semiconductor wafer fragment in process is indicated generally at reference numeral 10. Fragment 10 preferably comprises a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A first insulating layer 14 is formed over substrate 12 and has a preferred thickness from about 1000 to 20,000 Angstroms. A preferred material for first insulating layer 14 is oxide.

Figure 2:
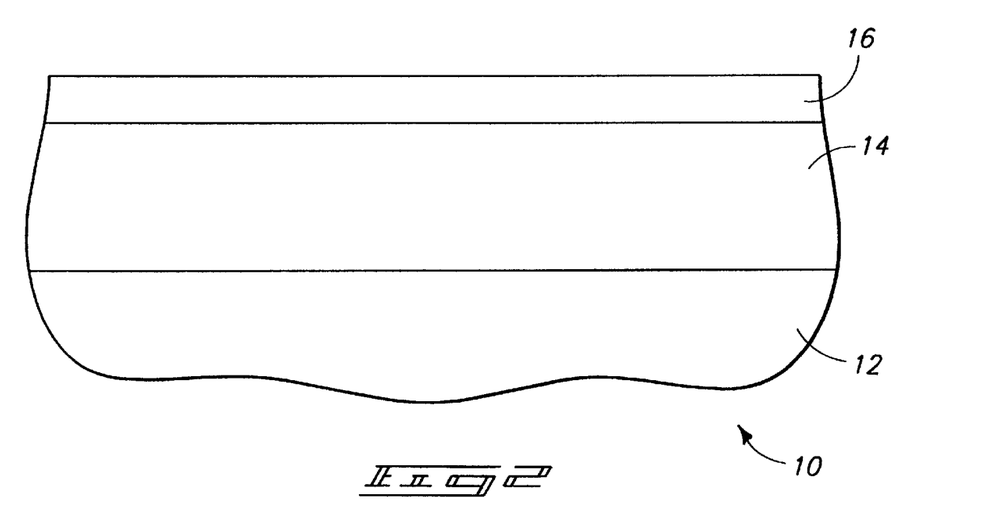
FIG. 2 is a view of the FIG. 1 wafer at a processing step subsequent to that shown by FIG. 1.

Referring to FIG. 2, a semiconductive material layer 16 is formed over first insulating layer 14 to an elevational thickness from preferably about 200 to 10,000 Angstroms. Preferably, layer 16 comprises silicon doped with a p-type material.

Figure 3:
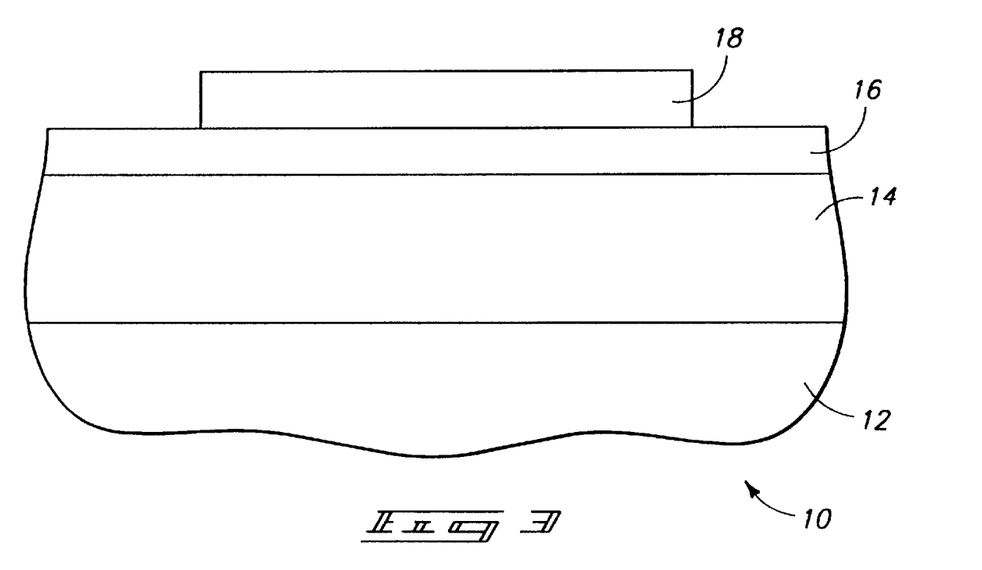
FIG. 3 is a view of the FIG. 1 wafer at a processing step subsequent to that shown by FIG. 2.

Referring to FIG. 3, a layer of patterned masking material 18 is formed over layer 16, an example masking material comprises photoresist.

Figure 4:
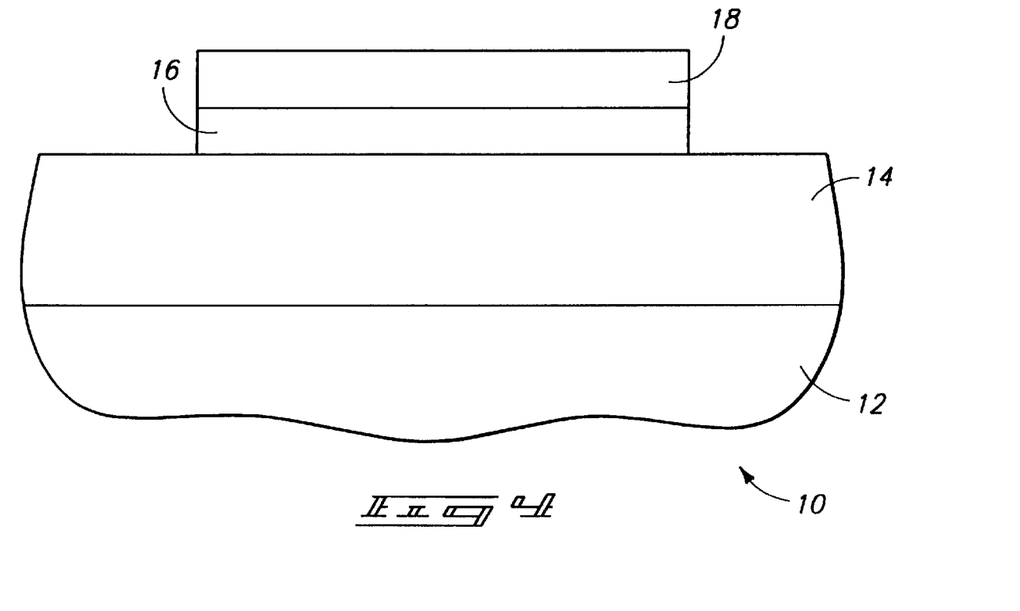
FIG. 4 is a view of the FIG. 1 wafer at a processing step subsequent to that shown by FIG. 3.

Referring to FIG. 4, unmasked portions of semiconductive material layer 16 are etched downwardly to first insulating layer 14 to a degree sufficient to expose underlying layer 14 portions.

Figure 5:
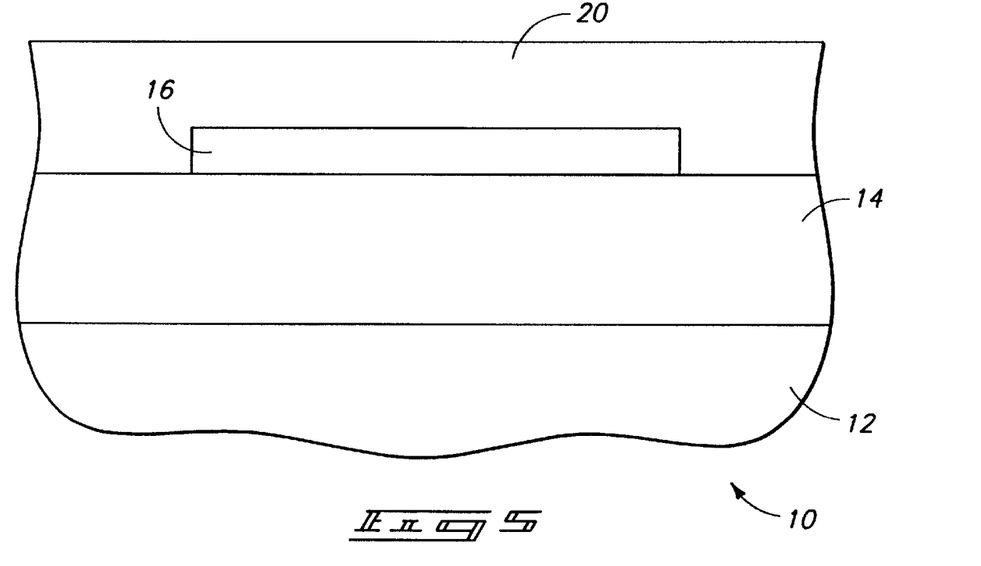
FIG. 5 is a view of the FIG. 1 wafer at a processing step subsequent to that shown by FIG. 4.

Referring to FIG. 5, with masking layer 18 having been suitably stripped away, a layer of insulating material 20 is formed over substrate 12. A suitable material is borophosphosilicate glass (BPSG). Although not specifically shown, a thin oxide layer formed from decomposition of tetraethyl orthosilicate (TEOS) can be formed over the substrate in advance of forming insulating material 20.

Figure 6:
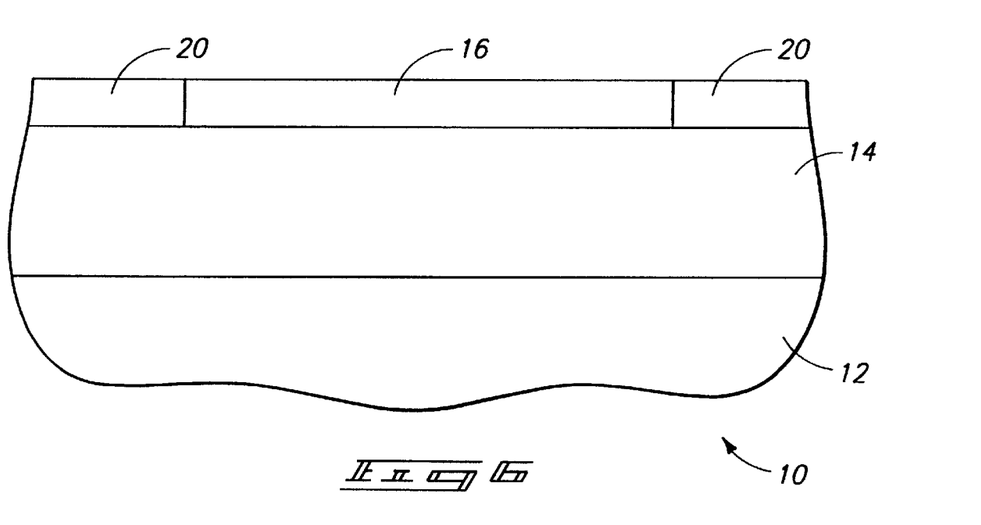
FIG. 6 is a view of the FIG. 1 wafer at a processing step subsequent to that shown by FIG. 5.

Referring to FIG. 6, insulating material layer 20 is planarized as by suitable mechanical abrasion of the substrate to leave behind individual isolation material/regions 20 on either side of semiconductive material layer 16. Such provides isolation regions over the semiconductor wafer. The FIG. 6 construction constitutes a semiconductive material-on-insulator substrate. In the preferred embodiment, such constitutes a silicon-on-insulator substrate. Accordingly, semiconductive material layer 16 constitutes a semiconductive active area and insulating material layers 20 on either side thereof constitute isolation regions which separate similarly formed active areas over wafer fragment 10. Isolation can also be provided through utilization of LOCOS (LOCal Oxidation of Silicon) techniques.

Figure 7:
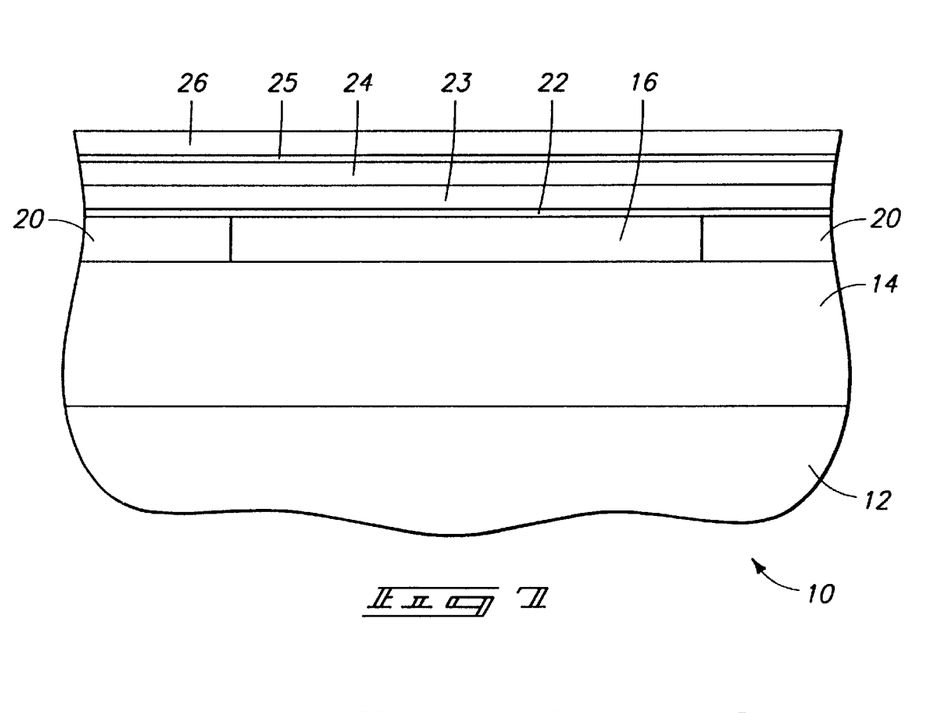
FIG. 7 is a view of the FIG. 1 wafer at a processing step subsequent to that shown by FIG. 6.
Figure 8:
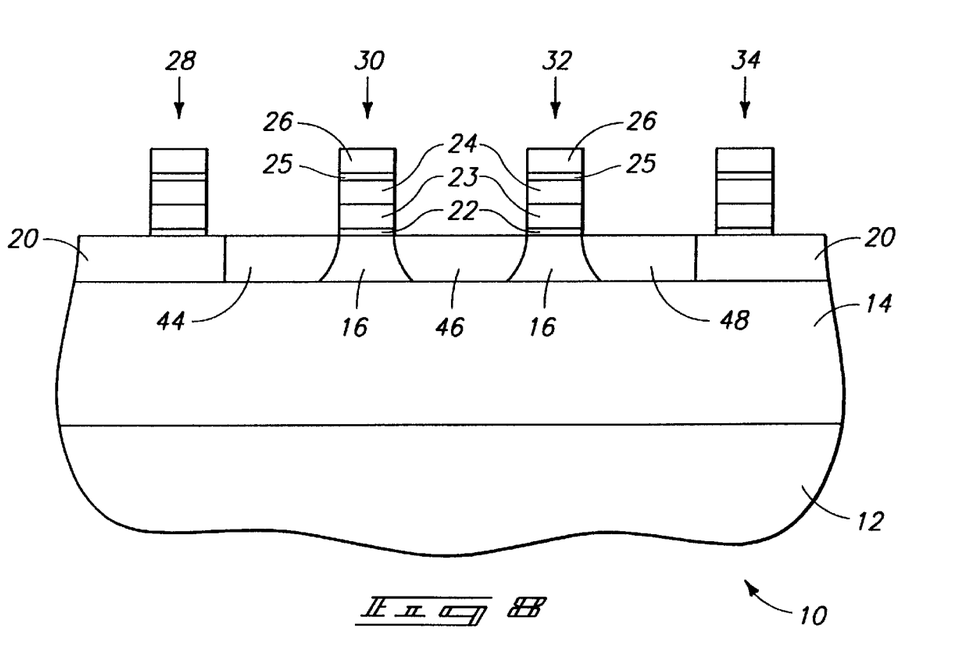
FIG. 8 is a view of the FIG. 1 wafer at a processing step subsequent to that shown by FIG. 7.

Referring to FIGS. 7 and 8, a plurality of layers are formed over substrate 12 including a thin oxide layer 22, a conductively doped polysilicon layer 23, a silicide layer 24, a thin oxide layer 25, and a masking layer 26, preferably of nitride. Such layers are subsequently patterned and etched (FIG. 8) to form conductive lines 28, 30, 32, and 34. The layered constitution of conductive lines 28, 30, 32, and 34 is but one example of a conductive line construction. Other layered constructions are possible. Conductive lines 28 and 34 overlie insulating material layer of regions 20, while conductive lines 30, 32 overlie the active area defined by semiconductive material layer 16. Accordingly, conductive lines 30, 32 constitute two laterally adjacent transistor gate or word lines which are formed over first insulating layer 14. Following the formation of conductive lines 28, 30, 32, and 34, n-type diffusion regions 44, 46, and 48 can be formed. Diffusion region 46 constitutes a first source/drain diffusion region which is formed within semiconductive material layer 16 and generally between conductive lines 30, 32. Diffusion region 44 constitutes a second source/drain diffusion region which is formed generally laterally outward of conductive lines 30, 32. Similarly, diffusion region 48 constitutes a third source/drain diffusion region which is formed generally laterally outward of conductive lines 30, 32.

In the illustrated and preferred embodiment, diffusion regions 44, 46, and 48 are formed within semiconductive material layer 16 and extend completely through the semiconductive material layer and contact or connect with underlying first insulating layer 14. The illustrated source/drain diffusion regions are operatively associated with respective transistor gates 30, 32 to form, in the illustrated and preferred embodiment, what will be a pair of dynamic random access memory (DRAM) cells 50 (FIG. 9).

Figure 9:
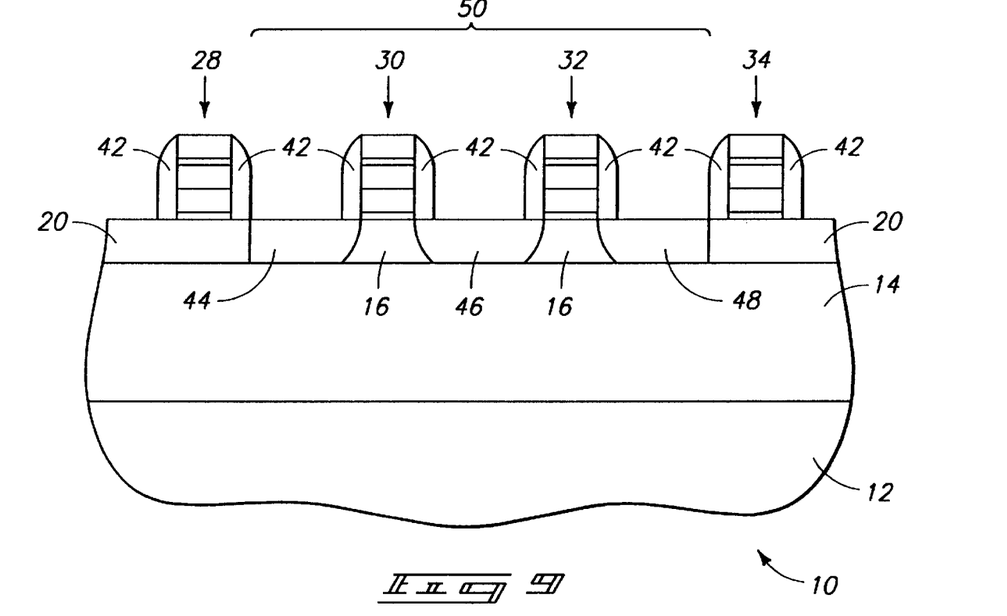
FIG. 9 is a view of the FIG. 1 wafer at a processing step subsequent to that shown by FIG. 8.

Referring to FIG. 9, sidewall spacers 42 are formed over the respective sidewalls of conductive lines 28, 30, 32, and 34.

Figure 10:
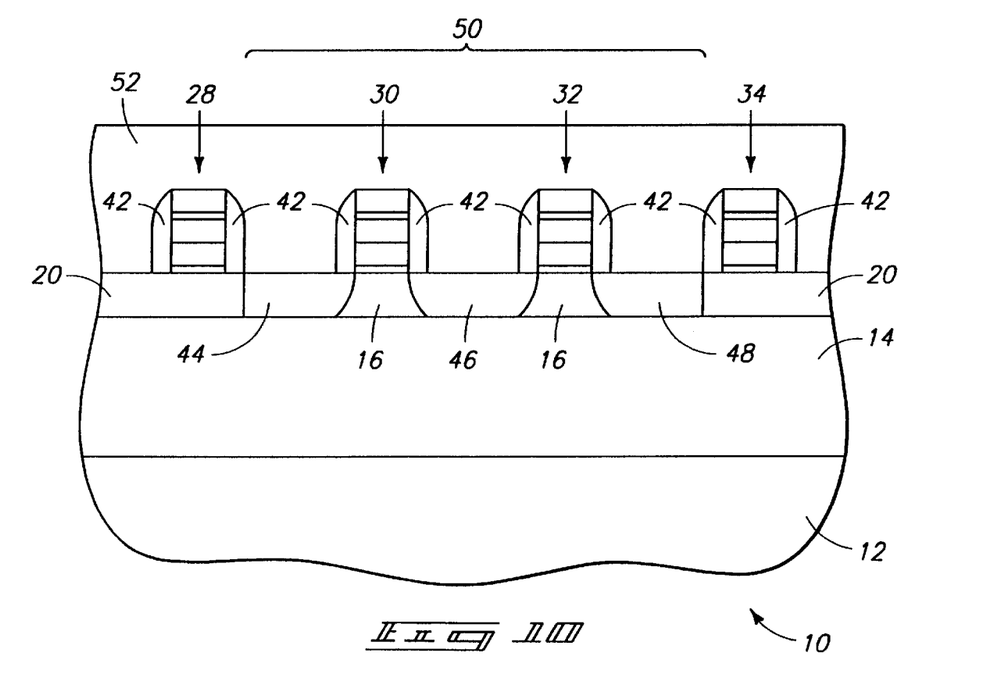
FIG. 10 is a view of the FIG. 1 wafer at a processing step subsequent to that shown by FIG. 9.

Referring to FIG. 10, a second insulating layer 52 is formed over the substrate including conductive lines 28, 30, 32, and 34 and semiconductive material layer 16. A preferred material for layer 52 comprises BPSG.

Figure 11:
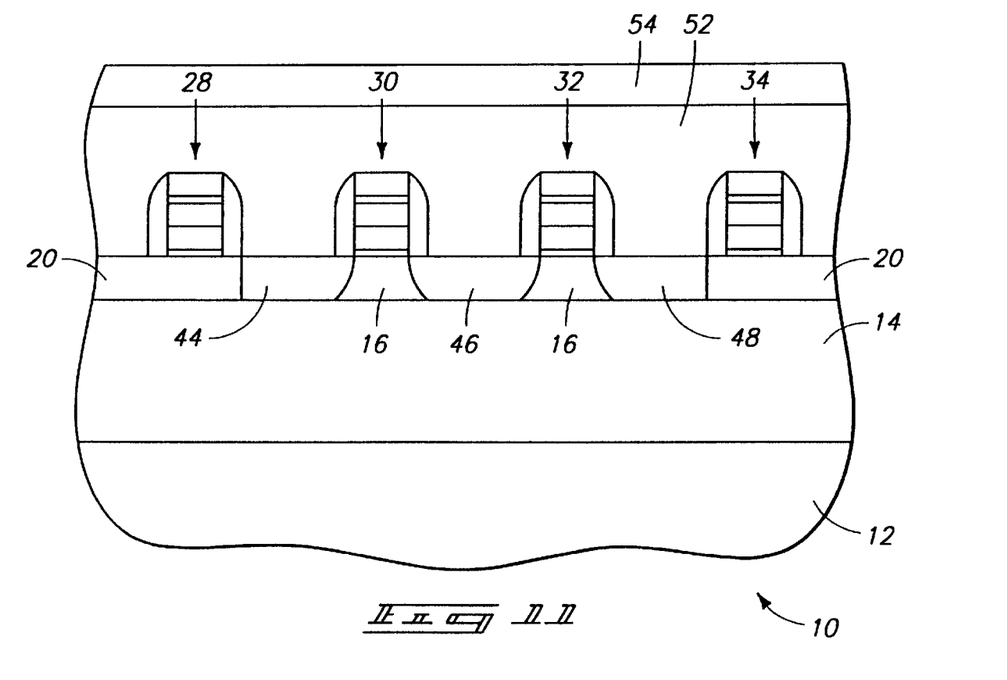
FIG. 11 is a view of the FIG. 1 wafer at a processing step subsequent to that shown by FIG. 10.
Figure 12:
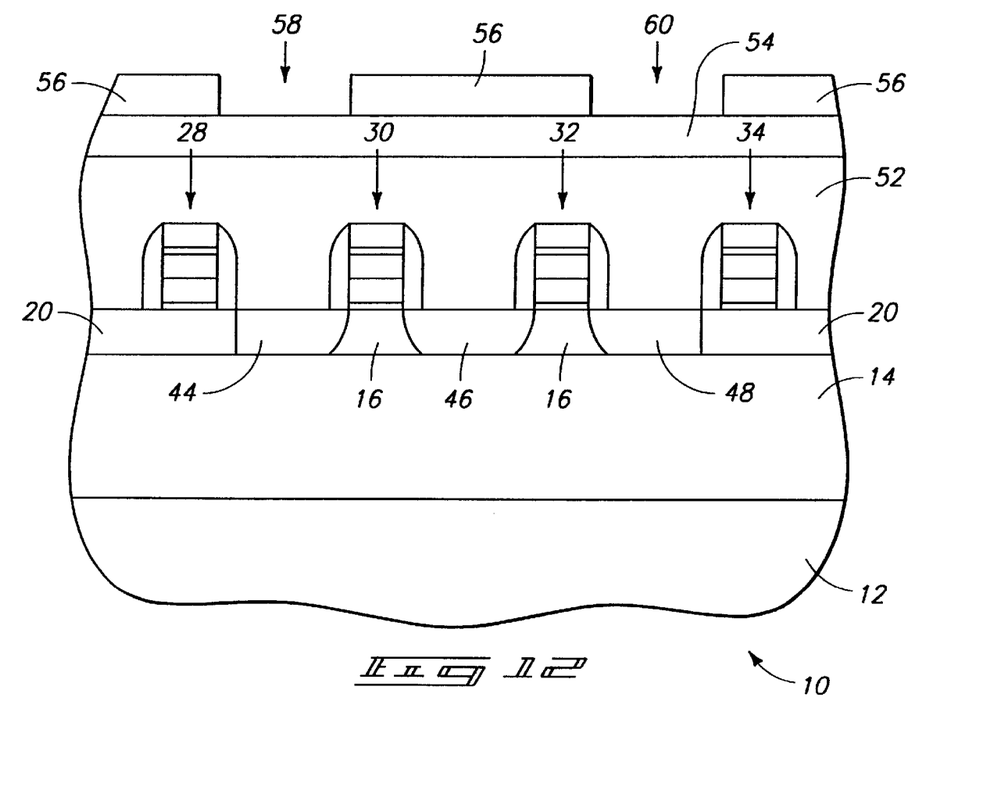
FIG. 12 is a view of the FIG. 1 wafer at a processing step subsequent to that shown by FIG. 11.

Referring to FIG. 11, a masking layer 54 is formed over or atop second insulating layer 52. In accordance with one aspect of the invention, masking layer 54 can comprise polysilicon, the utilization of which reduces polymer formation during subsequent etching to be described just below. A much more preferred material for masking layer 54 is photoresist which can be suitably patterned to define masking openings 58, 60 (FIG. 12). In the event that processing takes place utilizing the preferred photoresist material for layer 54, the etching of the capacitor container openings described below can take place essentially as described with reference to FIGS. 16–20 below. Of course, other masking materials can be utilized.

Referring to FIG. 12, a photoresist layer 56 is formed over masking material layer 54 and patterned to define mask openings 58, 60 elevationally over diffusion regions 44, 48 respectively.

Figure 13:
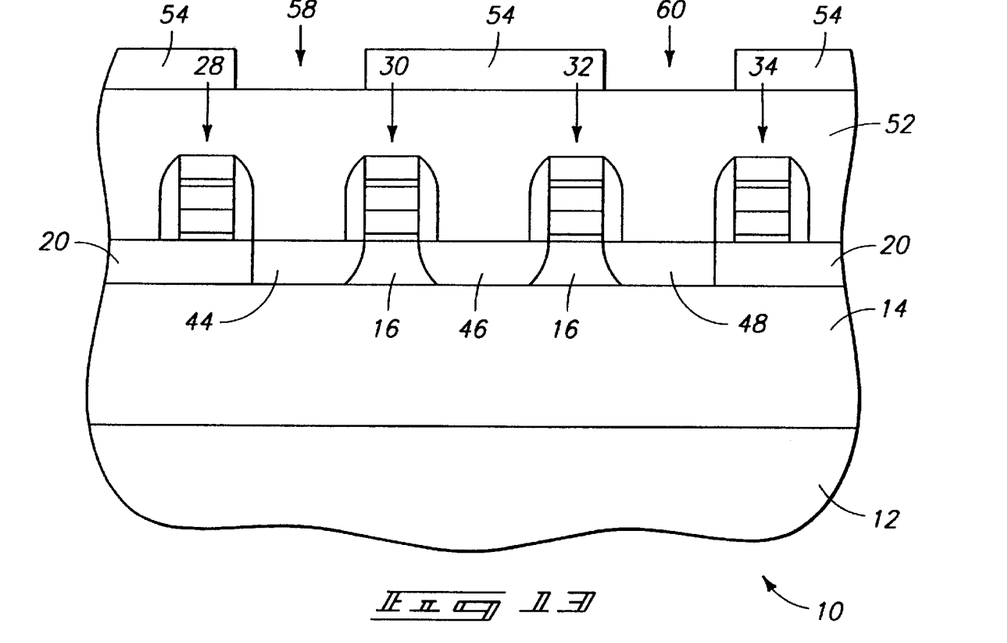
FIG. 13 is a view of the FIG. 1 wafer at a processing step subsequent to that shown by FIG. 12.

Referring to FIG. 13, masking material layer 54 is etched or otherwise removed through openings 58, 60 to form masking layer openings or capacitor container mask openings also designated 58, 60. The masking layer openings are defined by respective sidewalls of masking material layer 54 which are not specifically designated. Photoresist layer 56 has been suitably stripped in the FIG. 13 construction.

Figure 14:
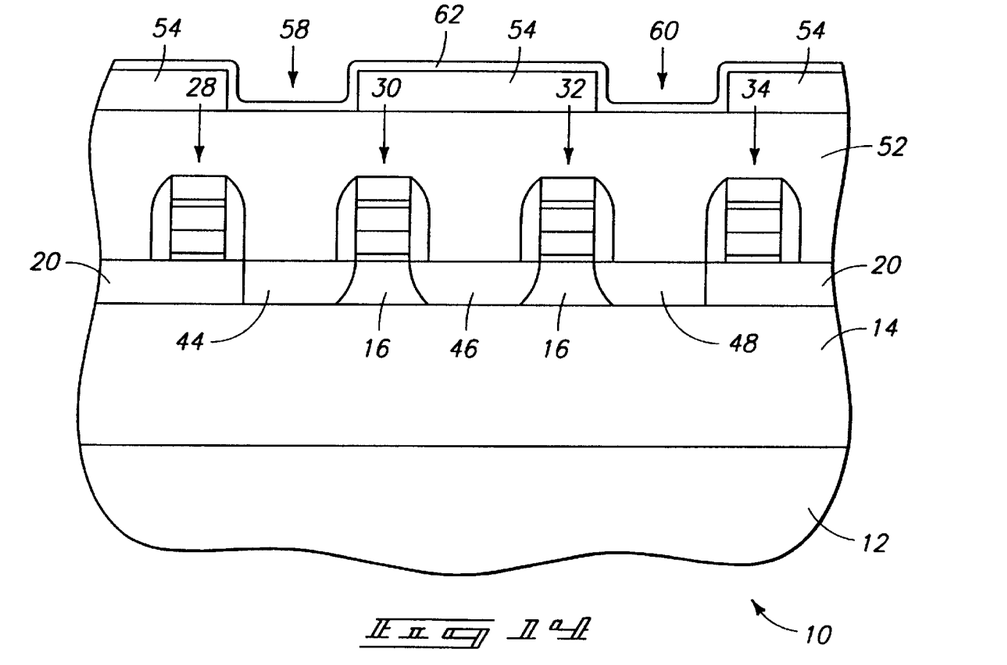
FIG. 14 is a view of the FIG. 1 wafer at a processing step subsequent to that shown by FIG. 13.

Referring to FIG. 14, a layer 62 comprising polysilicon is formed over masking material layer 54 and within masking layer openings 58, 60.

Figure 15:
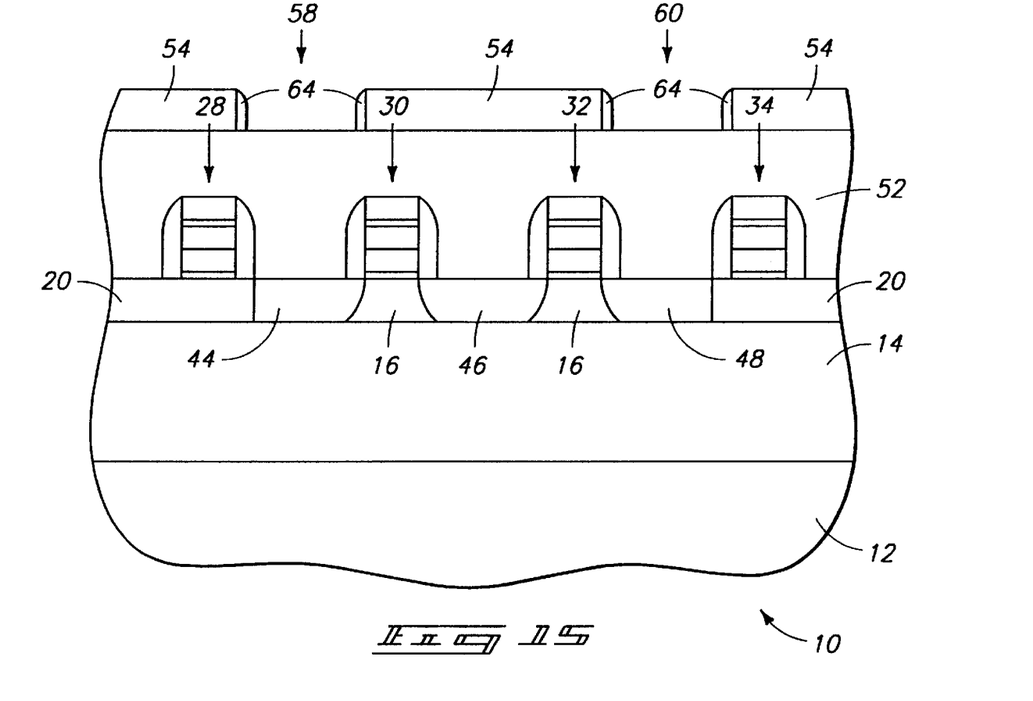
FIG. 15 is a view of the FIG. 1 wafer at a processing step subsequent to that shown by FIG. 14.

Referring to FIG. 15, portions of polysilicon layer 62 are removed, preferably by anisotropically etching the layer in a manner sufficient to provide polysilicon sidewall spacers 64 over the respective associated sidewall portions of masking material layer 54. Accordingly, such serves to narrow openings 58, 60.

Figure 16:
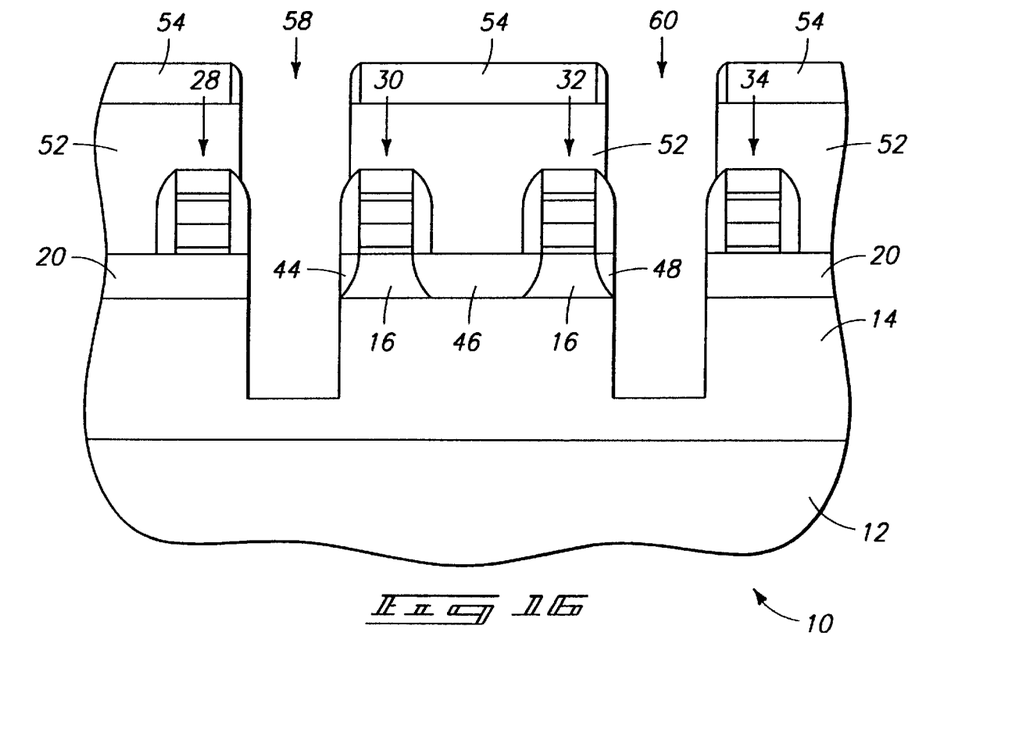
FIG. 16 is a view of the FIG. 1 wafer at a processing step subsequent to that shown by FIG. 15.

Referring to FIG. 16, exposed portions of second insulating layer 52 are etched through the capacitor container mask openings and elevationally downward to form capacitor container openings, also designated 58, 60. The illustrated etch into insulating layer 52 uses masking material layer 54 and sidewalls 64 as an etch mask and preferably extends elevationally downward to laterally adjacent conductive lines 30, 32. Preferably, such etch continues into at least a portion of semiconductive material layer 16, as shown. Accordingly, such etch extends into associated portions of respective diffusion regions 44, 48 which are disposed or received within the semiconductive material layer. In the illustrated and preferred embodiment, such etching continues completely through semiconductive material layer 16 to expose portions of first insulating layer 14. Even more preferably, such etching continues elevationally downward and into first insulating layer 14 to a desired depth which is intermediate the layer's elevational thickness. Accordingly, such etch is conducted entirely through associated portions of source/drain diffusion regions 44, 48 and provides a capacitor container opening which extends both elevationally above and below conductive lines 30, 32 and semiconductive material 16. It will be understood that a bit line contact opening can be formed intermediate conductive lines 30, 32 and through at least insulating layer 52 in connection with the formation of the capacitor container openings just described. Accordingly, formation of an associated bit line contact or contact plug within such bit line contact opening could take place after formation of the storage capacitors described just below.

Different etching regimes can, of course, be utilized to effectuate the above described etching of the capacitor containers. For example, a first oxide etch can be conducted which is suitable for etching BPSG layer 52. Upon exposure of associated diffusion regions 44, 48, such etch can be modified to etch the silicon-containing material from which layer 16 is formed. Subsequently, upon exposure of layer 14, such etch can be modified to a second oxide etch which is suitable for etching the material from which layer 14 is formed.

Figure 17:
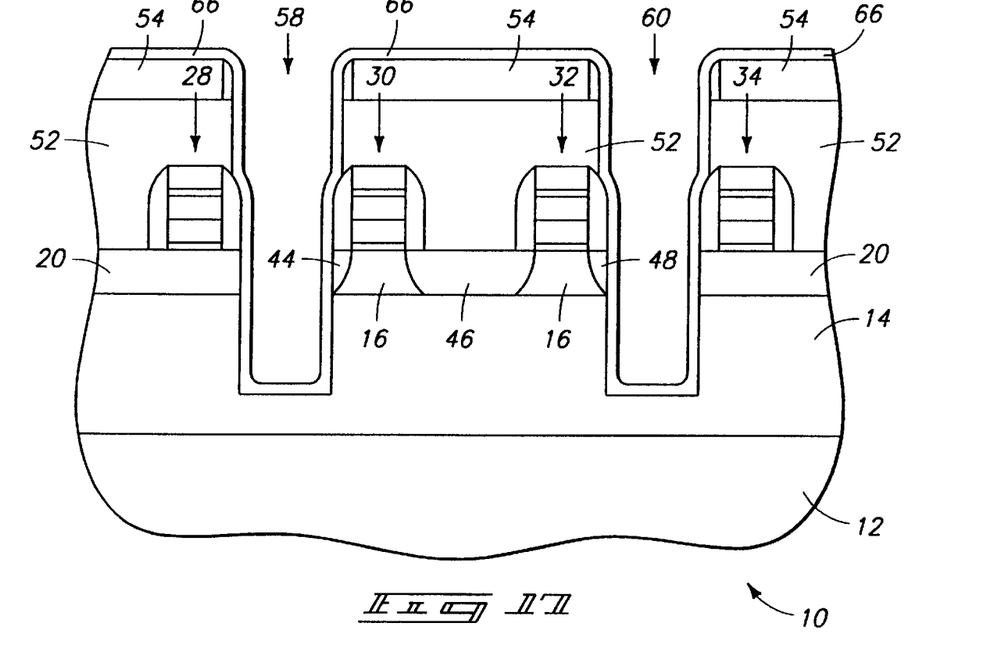
FIG. 17 is a view of the FIG. 1 wafer at a processing step subsequent to that shown by FIG. 16.

Referring to FIG. 17, a layer 66 of capacitor storage node material is formed within individual capacitor container openings 58, 60 and within the container defined thereby. In the illustrated and preferred embodiment, layer 66 is conductive and is formed within the individual capacitor container openings laterally adjacent and in electrical contact with respective second and third source/drain diffusion regions 44, 48. Suitable conductive materials include conductively doped chemical vapor deposited (CVD) polysilicon. Other preferred materials can include rugged polysilicon. Examples of rugged polysilicon include doped cylindrical grain polysilicon, doped hemispherical grain polysilicon, and selective hemispherical grain polysilicon, all of which can be used in connection with a separately provided conductively doped CVD polysilicon layer. In a preferred implementation, the conductive material from which storage node layer 66 is formed serves as a source of conductivity enhancing dopants for respective diffusion regions 44, 48, with outdiffusion therefrom serving to render the diffusion regions even more or suitably conductive. Such effectively provides respective conductively doped source regions for conductive lines 30, 32 which serve as access transistor gates for the illustrated DRAM cells.

Figure 18:
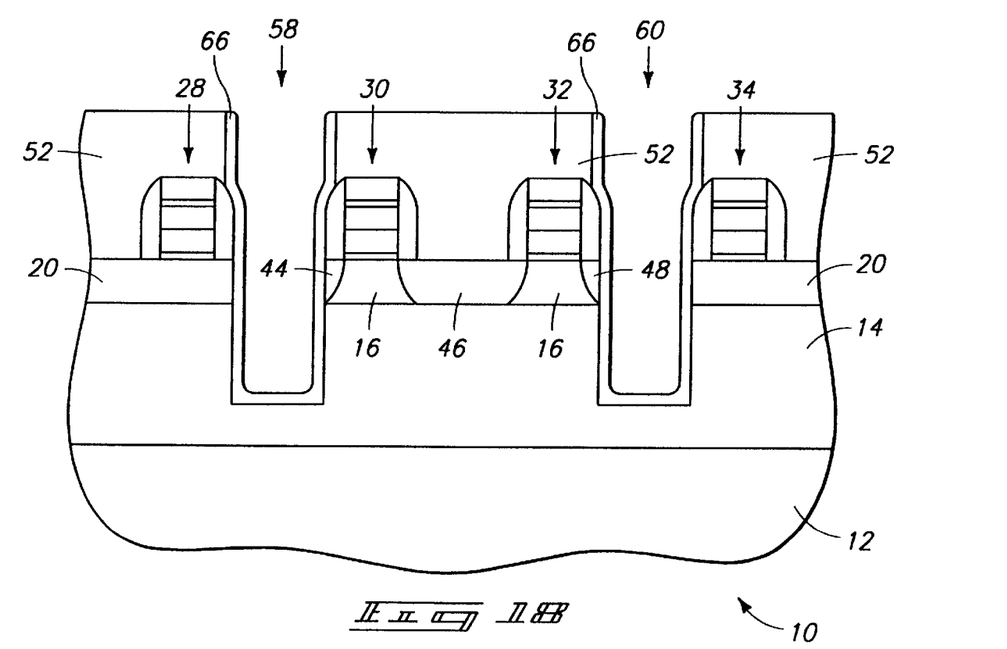
FIG. 18 is a view of the FIG. 1 wafer at a processing step subsequent to that shown by FIG. 17.

Referring to FIG. 18, substrate 12 is planarized as by suitable mechanical abrasion thereof in a manner which is sufficient to isolate node material 66 within the respective capacitor container openings 58, 60. Formation of storage capacitors proceeds in accordance with known processing principles.

Figure 19:
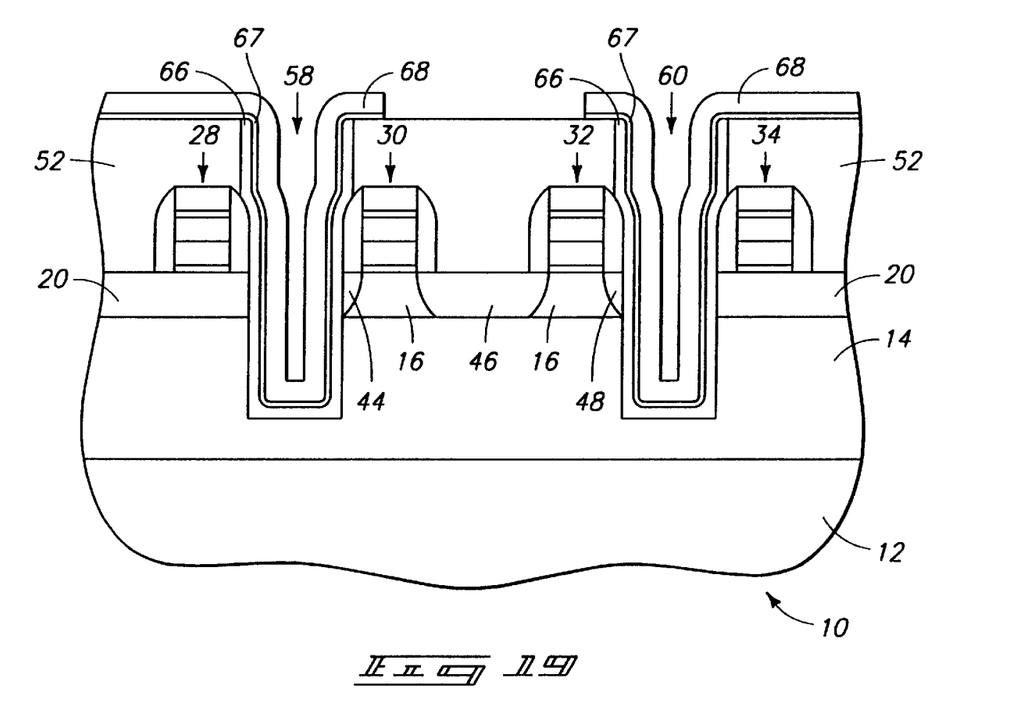
FIG. 19 is a view of the FIG. 1 wafer at a processing step subsequent to that shown by FIG. 18.

Referring to FIG. 19, capacitor dielectric material 67 is formed over storage node material 66 and within capacitor container openings 58, 60. Subsequently, cell plate structure 68 is formed within the capacitor containers and in operative association with the dielectric material to form capacitor constructions which are, in the preferred embodiment, disposed both elevationally above and elevationally below conductive lines or gates 30, 32. Patterning of layers 67 and 68 occurs over diffusion region 46 for subsequent isolated bit line contact formation.

Figure 20:
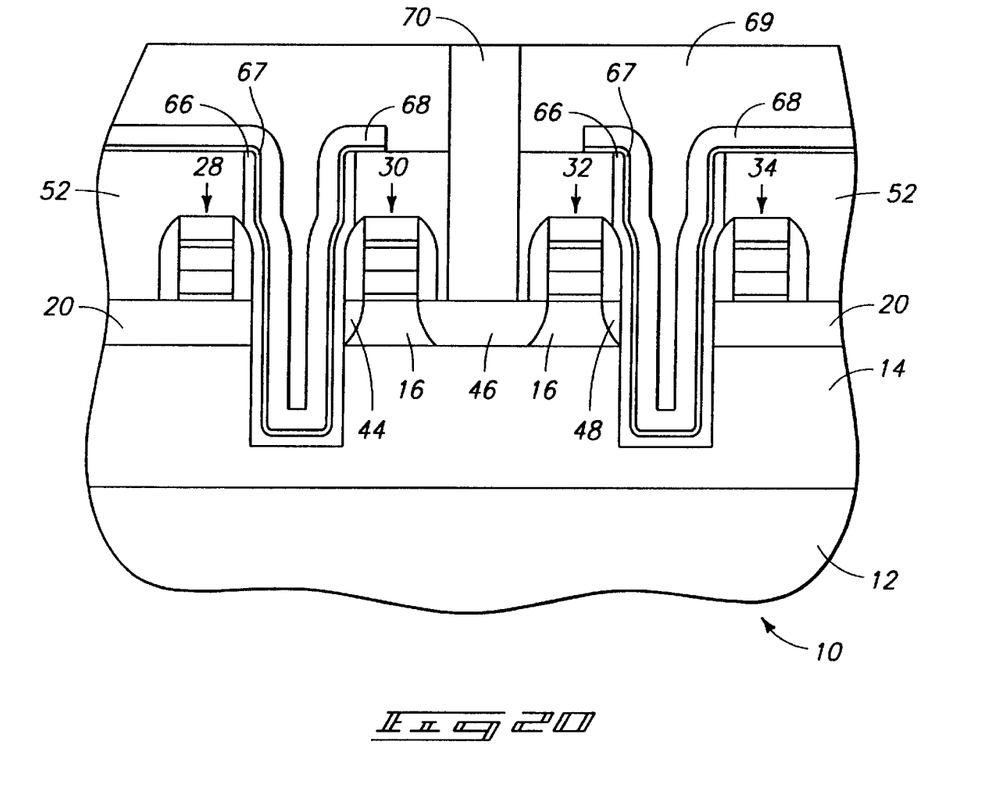
FIG. 20 is a view of the FIG. 1 wafer at a processing step subsequent to that shown by FIG. 19.

Referring to FIG. 20, an insulating layer 69 is formed over the substrate and a contact opening is subsequently patterned and etched over diffusion region 46. The contact opening is thereafter filled with conductive material to provide bit line contact 70.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor comprising:
    forming a semiconductive material layer over a first insulating layer;
    forming a gate over the semiconductive material layer;
    forming a source/drain diffusion region within the semiconductive material layer and operatively associated with the gate;
    forming a sidewall spacer operatively associated with the gate and over the source/drain diffusion region;
    forming a second insulating layer over the gate, sidewall spacer, and semiconductive material layer, the second insulating layer having a generally planar outer surface at an elevational level higher than any structure of the gate;
    etching a capacitor opening completely through the second insulating layer, exposing at least a portion of the sidewall spacer, and into the source/drain diffusion region of the semiconductive material layer; and
    forming a capacitor within the capacitor opening having conductive material laterally adjacent and in electrical contact with the source/drain diffusion region.

2. The method of forming a capacitor of claim 1, wherein the forming of the capacitor comprises:
    forming a layer of storage node material disposed and isolated within the capacitor opening, the storage node material extending downward beginning at the elevation of the outer surface of the second insulating layer and in electrical contact with the source/drain diffusion region;
    forming a capacitor dielectric layer disposed over the storage node material; and
    forming a cell plate structure operatively disposed relative to the capacitor dielectric layer, wherein the storage node material, capacitor dielectric layer, and cell plate structure extend both elevationally above and elevationally below the gate.

3. The method of forming a capacitor of claim 1, wherein the forming of the capacitor comprises forming conductively doped polysilicon material within the capacitor opening laterally adjacent and in electrical contact with the diffusion region, and further comprising outdiffusing conductivity enhancing impurity from the polysilicon material into the diffusion region.

4. The method of forming a capacitor of claim 1, wherein the etching of the capacitor opening comprises etching completely through the semiconductive material layer.

5. The method of forming a capacitor of claim 1, wherein the etching of the capacitor opening comprises etching completely through the semiconductive material layer and into the first insulating layer.

6. The method of forming a capacitor of claim 1, wherein the forming of the source/drain diffusion region comprises forming the diffusion region to extend elevationally completely through the semiconductive material and connect with the first insulating layer.

7. The method of forming a capacitor of claim 1, wherein:

the forming of the source/drain diffusion region comprises forming the diffusion region to extend elevationally completely through the semiconductive material and connect with the first insulating layer; and the etching of the capacitor opening comprises etching into the first insulating layer.

8. The method of forming a capacitor of claim 1, further comprising:

forming a masking layer over the second insulating layer prior to the etching a capacitor opening;

etching a mask opening at least partially through the masking layer, the mask opening having a sidewall; and forming a sidewall spacer against the mask opening sidewall to form a narrowed mask opening for use as an etch mask during the etching a capacitor opening.

* * * * *